US012587182B2

(12) United States Patent
Lee et al.

(10) Patent No.: US 12,587,182 B2
(45) Date of Patent: Mar. 24, 2026

(54) DUTY CYCLE CORRECTION CIRCUIT AND DUTY CYCLE CORRECTING METHOD

(71) Applicant: YANGTZE MEMORY TECHNOLOGIES CO., LTD., Wuhan (CN)

(72) Inventors: Byoungwoon Lee, Wuhan (CN); Jian Luo, Wuhan (CN); Hang Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 127 days.

(21) Appl. No.: 18/404,710

(22) Filed: Jan. 4, 2024

(65) Prior Publication Data

US 2024/0223172 A1    Jul. 4, 2024

Related U.S. Application Data

(63) Continuation of application No. PCT/CN2023/082098, filed on Mar. 17, 2023.

(60) Provisional application No. 63/436,449, filed on Dec. 30, 2022.

(51) Int. Cl.
*G11C 11/00* (2006.01)
*G11C 7/22* (2006.01)
*H03K 5/156* (2006.01)

(52) U.S. Cl.
CPC ........... *H03K 5/1565* (2013.01); *G11C 7/222* (2013.01)

(58) Field of Classification Search
CPC .............................. G11C 7/222; H03K 5/1565
See application file for complete search history.

(56) References Cited

U.S. PATENT DOCUMENTS

| | | | |
|---|---|---|---|
| 6,981,185 B1 | 12/2005 | Davis et al. | |
| 8,279,688 B2 * | 10/2012 | Liu ........................... | G11C 7/08 |
| | | | 365/233.5 |
| 8,773,186 B1 | 7/2014 | Liou et al. | |
| 10,218,343 B1 | 2/2019 | Tomar et al. | |
| 10,560,080 B1 | 2/2020 | Zhang et al. | |
| 2011/0309869 A1 | 12/2011 | Choi | |
| 2014/0133248 A1 * | 5/2014 | Huang ................. | G11C 7/1066 |
| | | | 365/189.07 |

(Continued)

OTHER PUBLICATIONS

International Search Report issued in corresponding International Application No. PCT/CN2023/082098, mailed Sep. 22, 2023, 7 pages.

(Continued)

*Primary Examiner* — Pho M Luu
(74) *Attorney, Agent, or Firm* — BAYES PLLC

(57) ABSTRACT

A duty cycle correction circuit can comprise at least one low pass filter configured to convert a clock signal to a voltage, and a voltage comparator configured to compare the voltage with a reference voltage to output a comparison signal. The duty cycle correction circuit can further comprise a controller configured to select, based on the comparing voltage, a duty cycle correction method from a first method and a second method different from the first method. The duty cycle correction circuit can further comprise a duty regulator configured to perform a duty tuning operation to adjust a duty of the clock signal using the selected duty cycle correction method.

20 Claims, 8 Drawing Sheets

300

(56) References Cited

U.S. PATENT DOCUMENTS

| 2014/0184294 | A1 | 7/2014 | Kang et al. |
| 2017/0126220 | A1 | 5/2017 | Elbadry |
| 2018/0006636 | A1* | 1/2018 | Ma .................... H03K 5/1565 |
| 2021/0152167 | A1 | 5/2021 | Doppalapudi et al. |

OTHER PUBLICATIONS

Truesdell Daniels et al: "A 0.5-V, 560-KHz 18.8-fJ/Cycle On-Chip Oscillator, With 96.1-ppm/° C Steady-State Stability Using a Duty-Cycled Digital Frequency-Locked Loop", IEEE Journal of Solid-State Circuits, IEEE, USA, vol. 56, No. 4, Jan. 14, 2021 (Jan. 14, 2021), pp. 1241-1253.

* cited by examiner

300

310     DUTY REGULATOR

320     LPF

330     VOLTAGE COMPARATOR

340     CONTROL LOGIC

500

600

700

DUTY CYCLE CORRECTION CIRCUIT AND DUTY CYCLE CORRECTING METHOD

CROSS-REFERENCE TO RELATED APPLICATIONS

This application is a continuation of International Application No. PCT/CN2023/082098, filed on Mar. 17, 2023, entitled "DUTY CYCLE CORRECTION CIRCUIT AND DUTY CYCLE CORRECTING METHOD," which claims the benefit of priority to U.S. Provisional Application No. 63/436,449, filed on Dec. 30, 2022, both of which are hereby incorporated by reference in their entireties.

TECHNICAL FIELD

The present disclosure generally relates to the field of signal processing technology, and more particularly, to a duty cycle correction circuit and a duty cycle correcting method.

BACKGROUND

High-speed lock signals are widely used for adjusting operational timing in various systems and circuits. While the high-speed clock signal is used inside of the systems and circuits, the high-speed clock signal is often distorted. Such distortion of the high-speed clock signal can cause unstable operations or even abnormal operations of the system. It is important to correct the distortion to secure a reliable operation. A duty cycle correction (DCC) circuit is generally required to correct the high-speed clock signal to a normal value.

SUMMARY

Duty cycle correction circuits and duty cycle correcting methods are disclosed.

One aspect of the present disclosure provides a method for duty cycle correction. The method can comprise: performing a first loop of duty tuning operations to a clock signal by using a first method; in response to determining that a first loop count of the first loop reaches a first threshold value, or determining that a duty cross occurs, performing a second loop of duty tuning operations to the clock signal by using a second method different from the first method; in response to determining that a second loop count of the second loop reaches a second threshold value, executing a duty check to the clock signal; and in response to determining that the clock signal has a duty within a target range, passing the duty cycle correction.

In some implementations, the first method is a linear approximation method; and the second method is a binary weighted approximation method.

In some implementations, the method can further comprise before performing the first loop of duty tuning operations, converting the clock signal to a pair of differentiated clock signals.

In some implementations, the method can further comprise converting the pair of differentiated clock signals to a pair of voltages, respectively; and comparing the pair of voltages to output a comparison signal to indicate whether the duty cross occurs.

In some implementations, the target range is from about 48% to about 52%.

Another aspect of the present disclosure provides a circuit for duty cycle correction, comprising: at least one low pass filter configured to convert a clock signal to a voltage; a voltage comparator configured to compare the voltage with a reference voltage to output a comparison signal; a controller configured to select, based on the comparing voltage, a duty cycle correction method from a first method and a second method different from the first method; and a duty regulator configured to perform a duty tuning operation to adjust a duty of the clock signal using the selected duty cycle correction method.

In some implementations, the first method is a linear approximation method; and the second method is a binary weighted approximation method.

In some implementations, the circuit can further comprise: a single-to-differential converter configured to convert the clock signal to a pair of differentiated clock signals.

In some implementations, the at least one low pass filter comprises a pair of low pass filters configured to convert the pair of differentiated clock signals to a pair of voltages, respectively; and the voltage comparator is configured to compare the pair of voltages to generate the comparison signal indicating whether a duty cross occurs.

In some implementations, the controller is further configured to: select the linear approximation method in response to the comparison signal indicating that the duty cross does not occur; and select the binary weighted approximation method in response to the comparison signal indicating that the duty cross occurs.

In some implementations, the controller is further configured to: count a first loop count of a first subset of loops of duty tuning operations using the linear approximation method; and in response to determining that the first loop count reaches a first threshold value, select the binary weighted approximation method.

In some implementations, the controller is further configured to: in response to determining that the first loop count does not reach the first threshold value and the comparison signal indicating that the duty cross does not occur, select the linear approximation method.

In some implementations, the controller is further configured to: count a second loop count of a second subset of loops of duty tuning operations using the binary weighted approximation method; and in response to determining that the second loop count reaches a second threshold value, perform a duty check operation to determine whether the clock signal has a duty within a target range.

In some implementations, the controller is further configured to: in response to determining that the duty of the clock signal is within the target range, generate a pass signal indicating that the duty cycle correction is successful; and in response to determining that the duty of the clock signal is without the target range, generate a fail signal indicating that the duty cycle correction is unsuccessful.

Another aspect of the present disclosure provides a memory system, comprising: a memory device; and a peripheral circuit configured to control the memory device, the peripheral circuit comprising a duty cycle correction circuit. The duty cycle correction circuit comprises: at least one low pass filter configured to convert a clock signal to a voltage, a voltage comparator configured to compare the voltage with a reference voltage to output a comparison signal, a controller configured to select, based on the comparing voltage, a duty cycle correction method from a first method and a second method different from the first method, and a duty regulator configured to perform a duty tuning operation to adjust a duty of the clock signal using the selected duty cycle correction method.

In some implementations, the first method is a linear approximation method; and the second method is a binary weighted approximation method.

In some implementations, the duty cycle correction circuit further comprises: a single-to-differential converter configured to convert the clock signal to a pair of differentiated clock signals.

In some implementations, the at least one filter comprises a pair of low pass filters configured to convert the pair of differentiated clock signals to a pair of voltages, respectively; and the voltage comparator is configured to compare the pair of voltages to generate the comparison signal indicating whether a duty cross occurs.

In some implementations, the controller is further configured to: count a first loop count of a first subset of loops of duty tuning operations using the linear approximation method; in response to determining that the first loop count reaches a first threshold value or the comparison signal indicating that the duty cross occurs, select the binary weighted approximation method; and in response to determining that the first loop count does not reaches the first threshold value and the comparison signal indicating that the duty cross does not occur, select the linear approximation method.

In some implementations, the controller is further configured to: count a second loop count of a second subset of loops of duty tuning operations using the binary weighted approximation method; and in response to determining that the second loop count reaches a second threshold value, perform a duty check operation to determine whether the clock signal has a duty within a target range.

Another aspect of the present disclosure provides a method for duty cycle correction, comprising: performing a loop of duty tuning operations to a clock signal by using a binary weighted approximation method; in response to determining that a loop count reaches a threshold value, executing a duty check to the clock signal; and in response to determining that the clock signal has a duty within a target range, passing the duty cycle correction.

In some implementations, the method further comprises: before performing the loop of duty tuning operations, converting the clock signal to a pair of differentiated clock signals.

In some implementations, performing each loop of duty tuning operation comprises: converting the pair of differentiated clock signals to a pair of voltages, respectively; comparing at least one of the pair of voltages with a reference voltage to output at least one comparing voltage; and adjusting at least one of the pair of differentiated clock signals by adjusting at least one of duty of the at least one of pair of differentiated clock signals by the binary weighted approximation method, based on the at least one comparing voltage.

In some implementations, the target range is from about 48% to about 52%.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
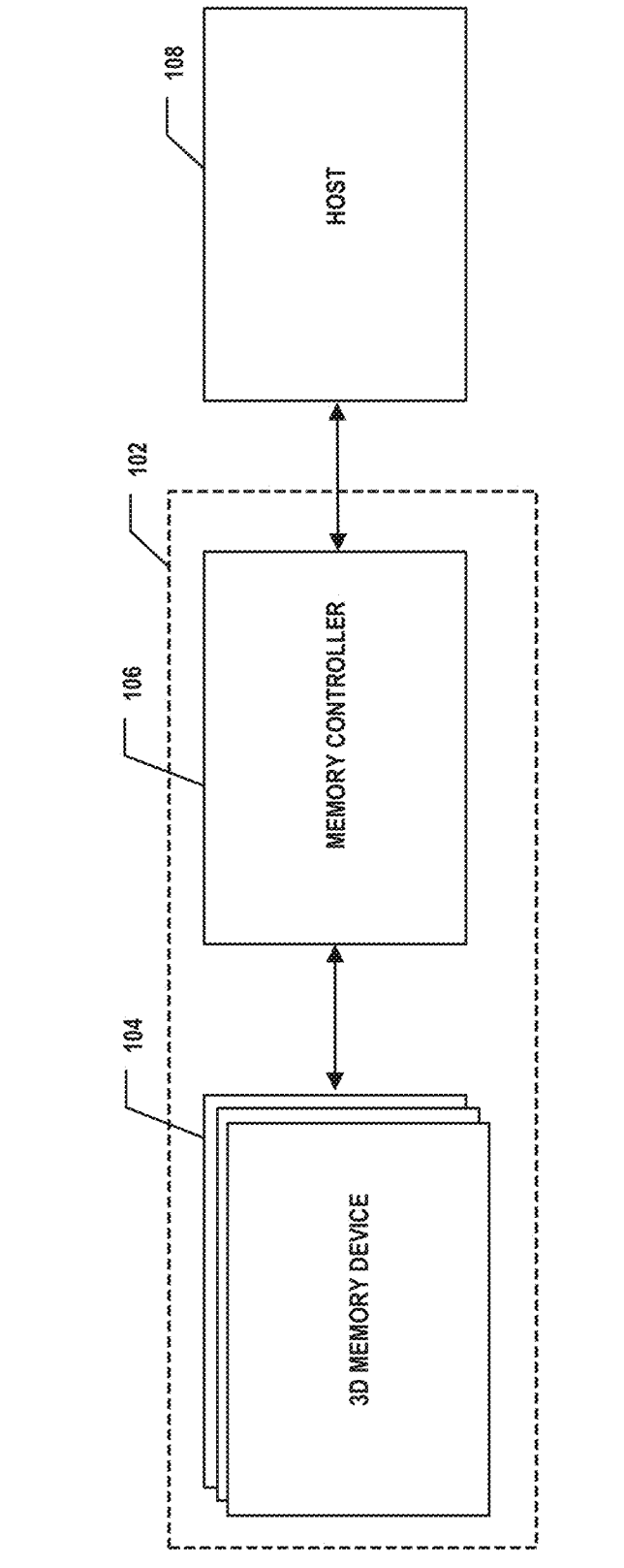
FIG. 1 illustrates a block diagram of an exemplary system having a memory device, according to some aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read-only memory (ROM); random access memory (RAM); magnetic disk storage media; optical storage media; flash memory devices; dynamic flash memory (DFM) devices, electrical, optical, acoustical, or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact, result from computing devices, processors, controllers, or other devices executing the firmware, software, routines, instructions, etc.

One aspect of the present disclosure provides a duty cycle correction circuit configured for correcting a high-speed clock signal. In some implementations, the high-speed clock signal is used for adjusting an operational timing in a memory system, such as timing of a programing operation, a reading operation, or a writing operation of a memory device in the memory system. The disclosed duty cycle correction circuit can be a portion of a control circuit of the memory device in the memory system. In some other implementations, the high-speed clock signal is used for adjusting operational timing in any other suitable semiconductor systems or circuits.

FIG. 1 illustrates a block diagram of a system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a 3D memory device. In some implementations, each memory device 104 includes one or more memory cell arrays and one or more peripheral circuits of the memory cell arrays. In some implementations, memory device 104 can be any suitable memory device including, but not limited to read-only memory (ROM) device, random access memory (RAM) device, magnetic disk memory device, optical memory device, flash memory device, dynamic flash memory (DFM) device, etc.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. In some implementations, memory controller 106 includes a duty cycle correction circuit configured for correcting a high-speed clock signal.

Memory controller 106 can be configured to control operations of memory device 104, such as read, erase, and program operations. In some implementations, memory controller 106 is configured to control the array of memory cells through the peripheral circuit. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products.

Figure 2B:
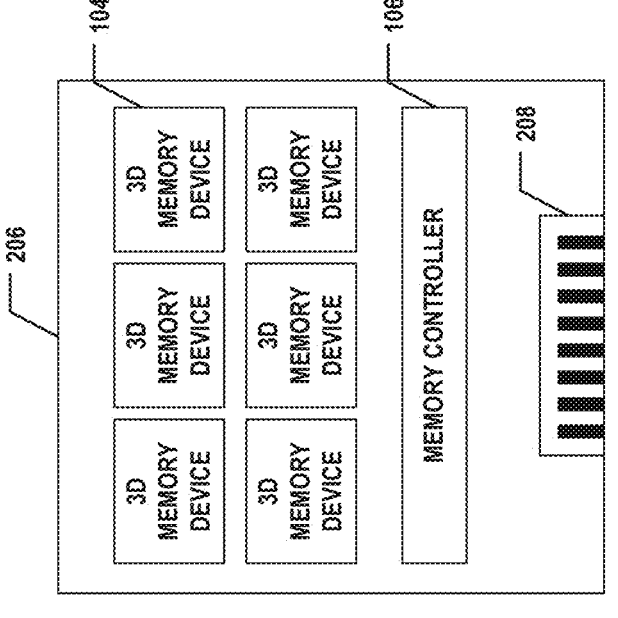
FIG. 2B illustrates a diagram of an exemplary solid-state drive (SSD) having a memory device, according to some aspects of the present disclosure.
Figure 2A:
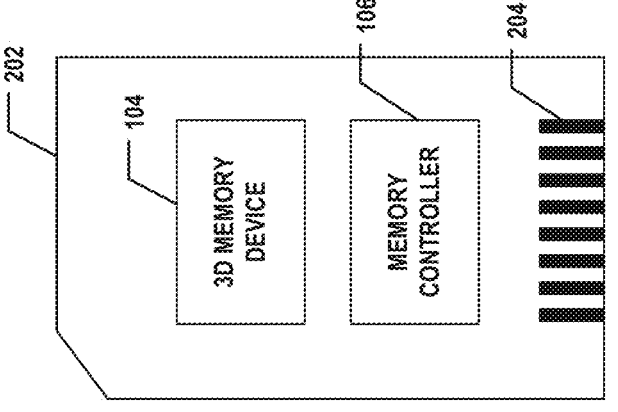
FIG. 2A illustrates a diagram of an exemplary memory card having a memory device, according to some aspects of the present disclosure.

In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
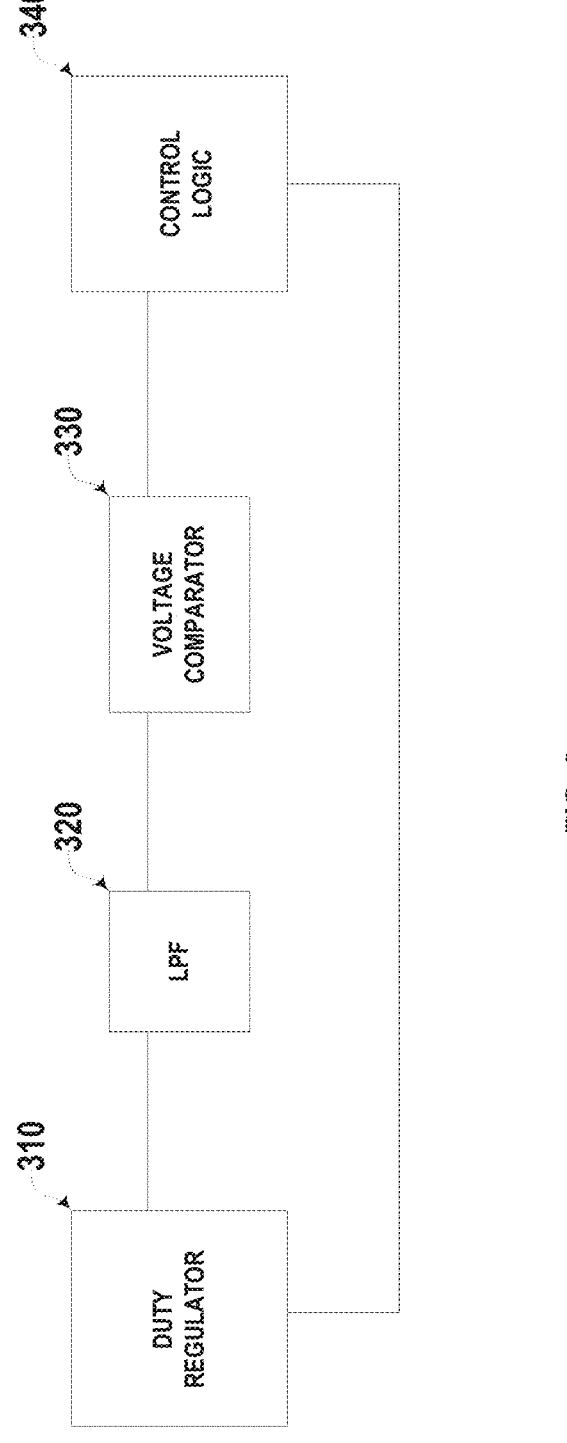
FIG. 3 illustrates a block diagram of a duty cycle correction (DCC) circuit 300, according to some aspects of the present disclosure.

FIG. 3 illustrates a block diagram of a duty cycle correction (DCC) circuit 300, according to some aspects of the present disclosure. DCC circuit 300 can be an analog DCC circuit, a digital DCC circuit, or a digital-analog hybrid DCC circuit. In some implementations, the analog DCC circuit can have a high correction precision, the digital DCC circuit can have a high correction speed, and the digital-analog hybrid DCC circuit can combine a digital DCC sub-circuit and an analog DCC sub-circuit to obtain a tradeoff between the correction speed and the correction precision.

As shown in FIG. 3, DCC circuit 300 can include a duty regulator 310, a low pass filter (LPF) 320, a voltage comparator 330, and a control logic 340. The LPF 320 is configured for receiving an input clock signal, and converting a clock signal to a voltage signal. The voltage comparator 330 is connected to the LPF 320 to receive the voltage signal, and is configured for comparing the voltage signal to a reference voltage to output a comparison signal. The control logic 340 is connected to the voltage comparator 330 to receive the voltage signal, and is configured to generate a control signal according to the comparison signal. The duty regulator 310 is connected to the control logic 340 to receive the control signal, and is configured to adjust the duty cycle of the clock signal based on the control signal.

Figure 4:
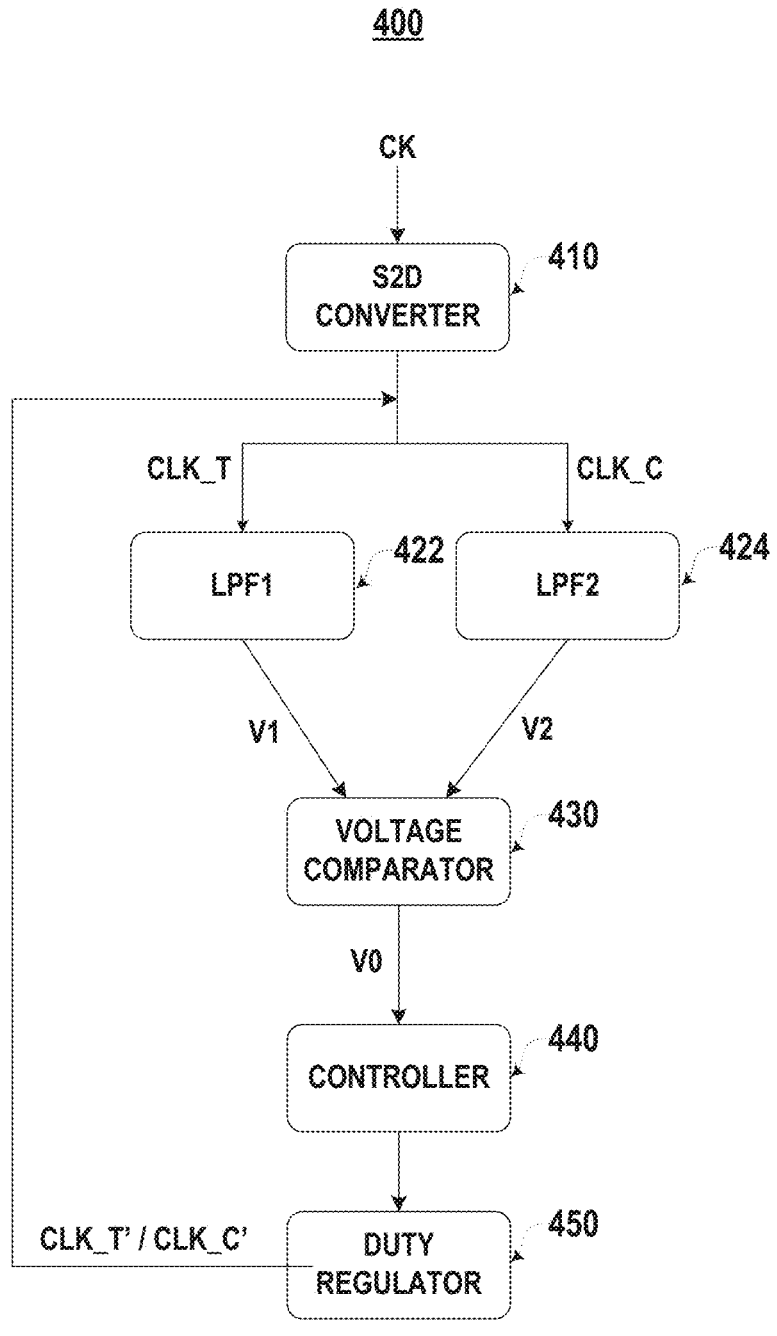
FIG. 4 illustrates a flow diagram of a duty cycle correcting process, according to some aspects of the present disclosure.

FIG. 4 illustrates a flow diagram of a duty cycle correcting process 400 using DCC circuit 300, according to some aspects of the present disclosure. As shown in FIG. 4, a clock signal CK, such as a high-speed clock signal, can be transmitted to a signal-to-differential (S2D) converter 410. The S2D converter 410 is configured to convert the clock signal CK to a pair of differentiated clock signals, such as true clock signal CLK_T and complementary clock signal CLK_C.

In some implementations in a memory system, a positive clock edge for a memory device refers to the point where the rising true clock signal CLK_T crosses the falling complementary clock signal CLK_C, while the negative clock edge indicates that the transition of the falling true clock signal CLK_T and the rising of the complementary clock signal CLK_C. Operational commands (e.g., read command, write command, etc.) of the memory device are typically entered on the positive edges of the clock signal, and data is transmitted or received on both the positive and negative clock edges.

As shown in FIG. 4, a pair of low pass filters (LPFs) 422 and 424 can be configured to convert the pair of differentiated clock signals to a pair of voltage signals, respectively. Specifically, true clock signal CLK_T can be converted by the first LPF 422 to a first voltage V1, and complementary clock signal CLK_C can be converted by the second LPF 424 to a second voltage V2. The pair of voltages V1 and V2 can be inputted into a voltage comparator 430 to compare with each other. An output voltage V0 of the voltage comparator 430 can indicate the comparison result.

At least based on the comparison result, a controller 440 can determine a duty cycle correction method. In some implementations, the controller 440 can be configured to select one cycle correction method of two or more cycle correction methods. For example, controller 440 can select a duty cycle correction method from a linear approximation method or a binary weighted approximation method. It is noted that the selection of the duty cycle correction method can be determined based at least on the output voltage V0 of the voltage comparator 430, and any other suitable factors. According to the control signal outputted by the controller 440, the duty regulator 450 can perform the selected duty cycle correction method to regulate the pair of differentiated clock signals by adjusting duties of the pair of differentiated clock signals. As such, the adjusted true clock signal CLK_T' and the regulated complementary clock signal CLK_C' can be outputted by the duty regulator 450 for a next loop.

Figure 5:
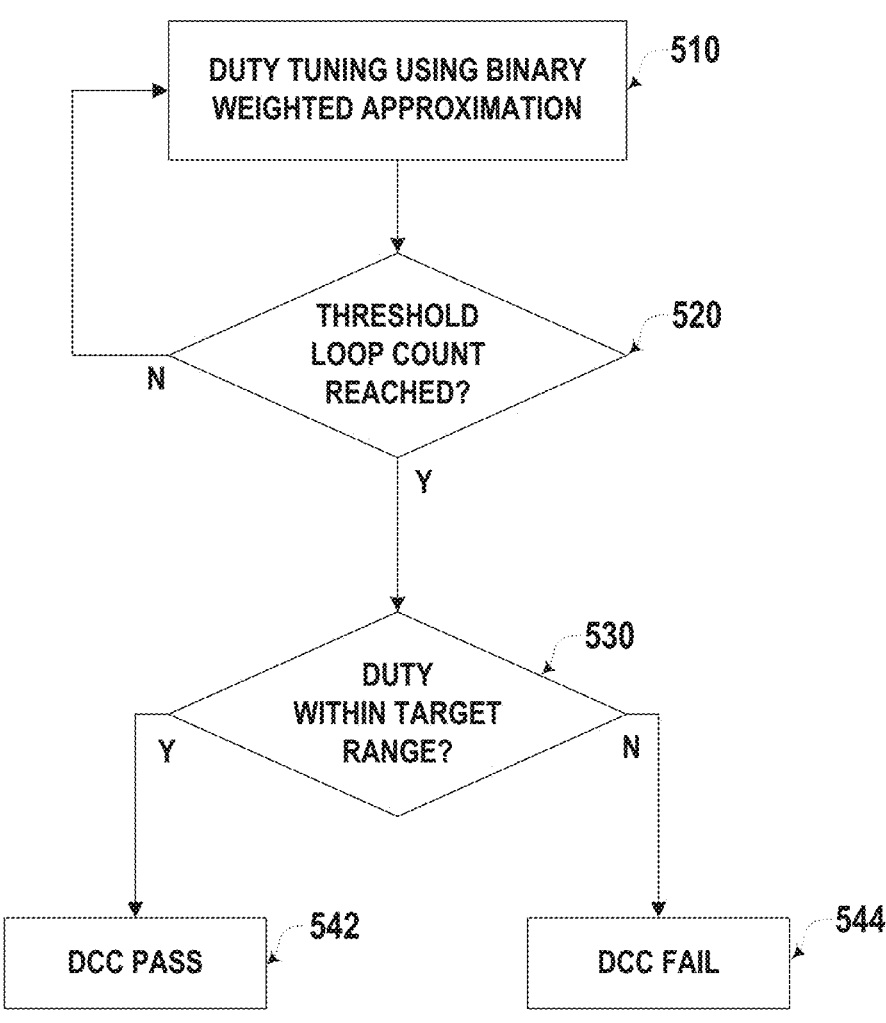
FIG. 5 illustrates a flow diagram of a duty cycle correcting method, according to some aspects of the present disclosure.

FIG. 5 illustrates a flow diagram of a duty cycle correcting method 500, according to some aspects of the present disclosure. In some implementations, duty cycle correcting method 500 can be performed by the DCC circuit 300 described above in connection with FIGS. 3 and 4.

As shown in FIG. 5, duty cycle correcting method 500 can start at operation 510, in which a duty tuning operation can be performed to a clock signal by using a binary weighted approximation method. In some implementations, the controller 440 can determine that a binary weighted approximation method is selected to regulate the duty of the true clock signal CLK_T or the complementary clock signal CLK_C. The duty regulator 450 can perform a duty tuning operation by using a binary weighted approximation method to adjust the duty of the true clock signal CLK_T or the duty of the complementary clock signal CLK_C.

At operation 520, duty cycle correcting method 500 can determine whether a loop count reaches a threshold value. In some implementations, after the duty regulator 450 performs a duty tuning operation, the controller 440 can increase a loop count of performed duty tuning operations by one. The controller 440 can further compare the loop count with a threshold value. In some implementations, the threshold loop count value can be predetermined to set a maximum time up-limit of the duty correction process. In response to the loop count is less than the predetermined threshold value ("N" at operation 520), duty cycle correcting method 500 can loop back to operation 510 to perform a next duty tuning operation.

In response to the loop count being equal to or larger than the predetermined threshold value ("Y" at operation 520), duty cycle correcting method 500 can proceed to operation 530 to execute a duty check. The duty check is executed to determine whether the duty of the clock signal is within a target range. In some implementations, a target range of the duty of the clock signal can be predetermined, such as a range between 45% to 55%, a range between 48% to 52%, or a range between 49% to 51%. After a certain number of loops of the duty tuning operations performed at 510, the controller 440 can determine whether the duty of the true clock signal CLK_T or the duty of the complementary clock signal CLK_C is within the predetermined target range. In response to determining that the duty of the clock signal is within the target range ("Y" at operation 530), the controller 440 can determine that the duty cycle correction (DCC) process is successful, and can generate a DCC pass signal at operation 542. In response to determining that the duty of the clock signal is not within the target range ("N" at operation 530), the controller 440 can determine that the duty cycle correction (DCC) process is unsuccessful, and can generate a DCC fail signal at operation 544.

Figure 6:
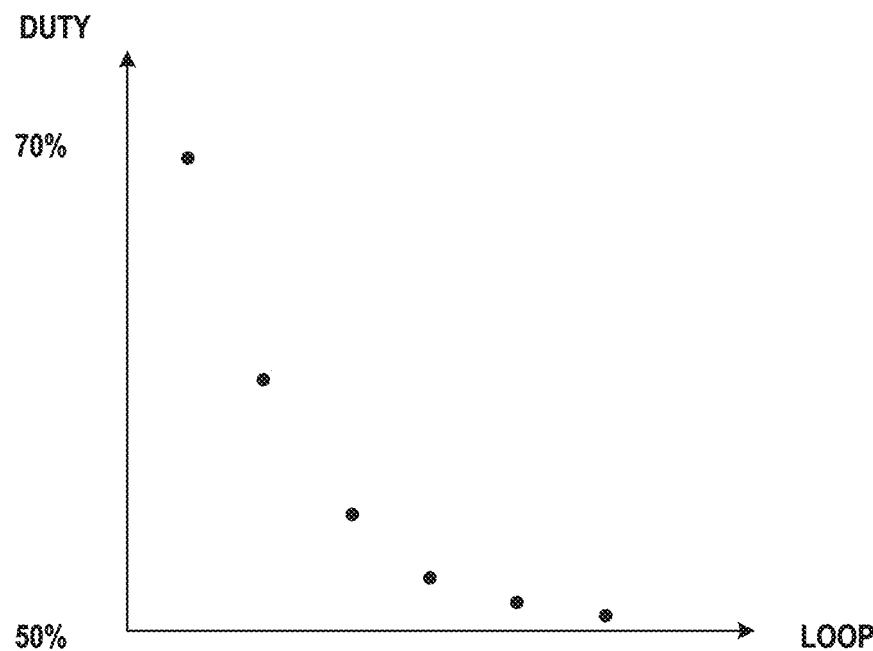
FIG. 6 is an exemplary diagram showing a duty value change of a clock signal versus a number of loops of duty tuning operations using the duty cycle correcting method of FIG. 5, according to some aspects of the present disclosure.

FIG. 6 is an exemplary diagram showing a duty value change of a clock signal versus a number of loops of duty tuning operations using a binary weighted approximation method. Compared to the linear approximation method, in which each loop has a fixed tuning step, the binary weighted approximation method can have a variable tuning step depending on the current value of the clock signal duty. Specifically, the binary weighted approximation method can adjust the duty by a large tuning step in a duty tuning loop when the clock signal duty is far from the target range, and can adjust the duty by a small tuning step in a duty tuning loop when the clock signal duty is close the target range.

For example, as shown in FIG. 6, in the first duty tuning loop, the clock signal having a duty cycle of around 70% can be tuned to less than 60% by decreasing a large tuning step of more than 10%. In a fifth duty tuning loop, the clock signal having a duty cycle of around 52% can be tuned to about 51% by decreasing a small tuning step of about 1%. It is note that, when using the linear approximation method having a large tuning step, the final duty value may not be precisely adjusted into a small target range. When using the linear approximation method having a small tuning step, the duty cycle correction process may take a large amount of time due to the large number of loops. By using the binary weighted approximation method, a high correction speed and a high correction precision can both be achieved. For example, as shown in FIG. 6, a clock signal having a duty cycle of around 70% can be tuned within a small target range close to 50% in merely 5 loops of duty tuning operations by using the binary weighted approximation method.

Figure 7:
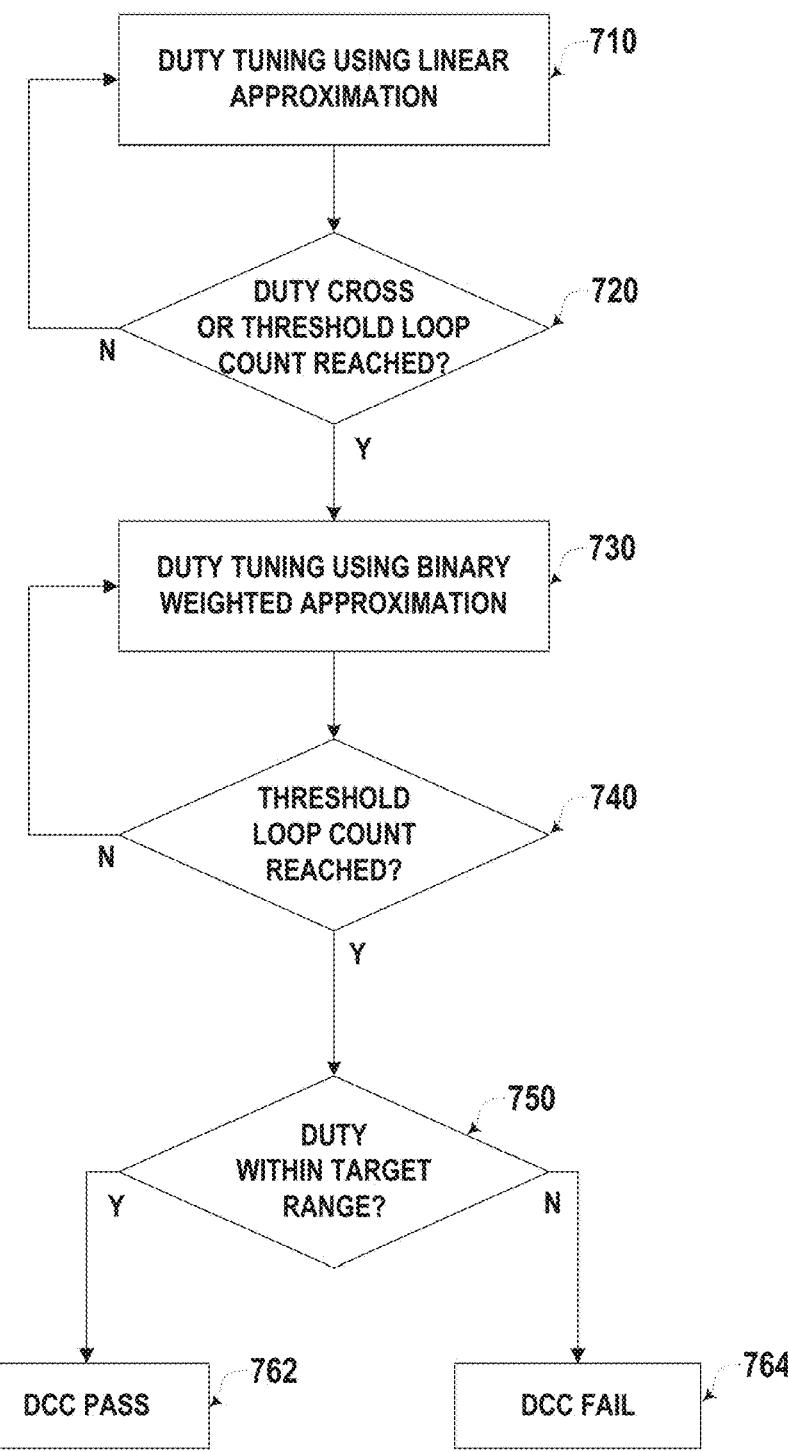
FIG. 7 illustrates a flow diagram of another duty cycle correcting method, according to some aspects of the present disclosure.
Figure 8:
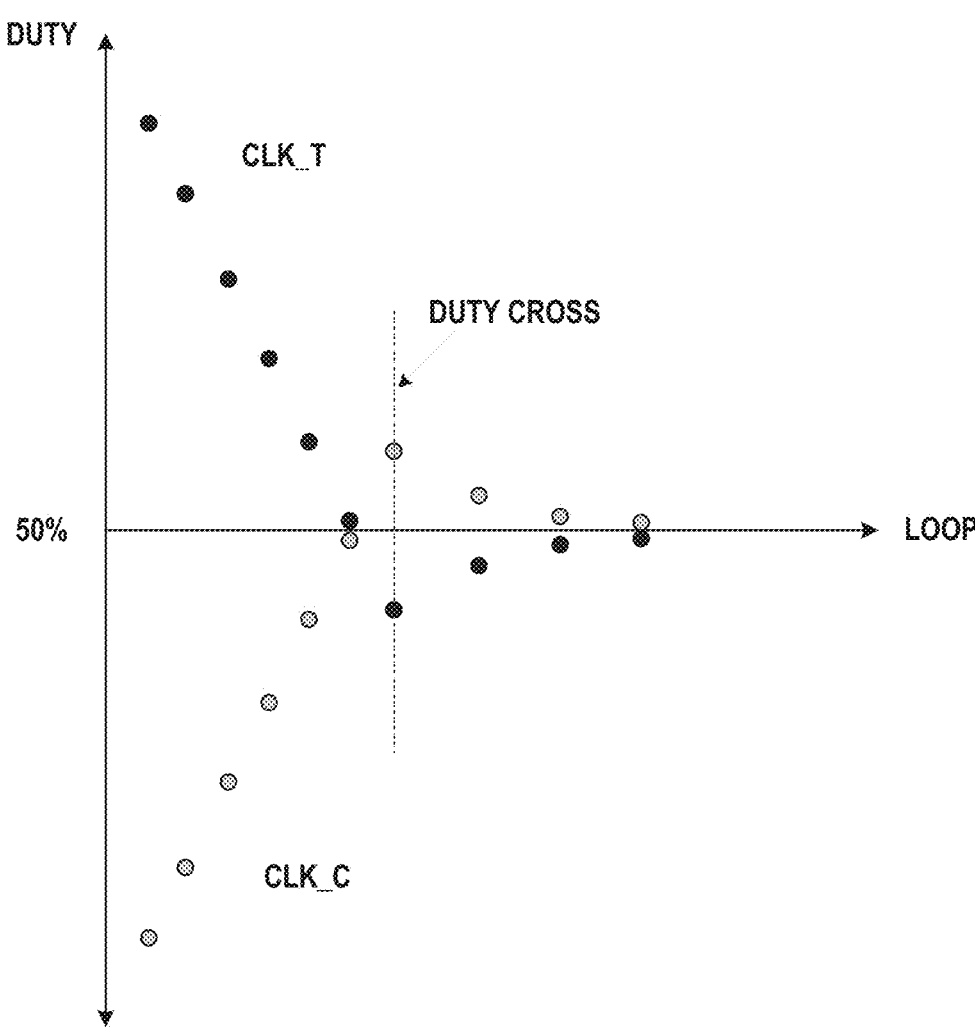
FIG. 8 is an exemplary diagram showing a duty value change of a clock signal versus a number of loops of duty tuning operations using the duty cycle correcting method of FIG. 7, according to some aspects of the present disclosure.

FIG. 7 illustrates a flow diagram of a duty cycle correcting method 700 using both linear approximation and binary weighted approximation, according to some aspects of the present disclosure. In some implementations, duty cycle correcting method 700 can be performed by the DCC circuit 300 described above in connection with FIGS. 3 and 4. FIG. 8 is an exemplary diagram showing a duty value change of a clock signal versus a number of loops of duty tuning operations using both linear approximation and binary weighted approximation. In some implementations, duty cycle correcting method 700 can first perform a first subset of loops of duty tuning operations using the linear approximation, and then perform a second subset of loops of duty tuning operations using the binary weighted approximation.

As shown in FIG. 7, duty cycle correcting method 700 can start at operation 710, in which a duty tuning operation can be performed to a clock signal by using a linear approximation method. In some implementations, controller 440 can determine that a linear approximation method is firstly selected to regulate the duty of the true clock signal CLK_T and the complementary clock signal CLK_C. The duty regulator 450 can perform a duty tuning operation by using the linear approximation method to adjust the duty of the true clock signal CLK_T and the duty of the complementary clock signal CLK_C.

At operation 720, duty cycle correcting method 700 can determine whether a loop count reaches a threshold value and whether a duty cross occurs. In some implementations, after the duty regulator 450 performs a duty tuning operation, the controller 440 can increase a loop count of performed duty tuning operations by one. The controller 440 can further compare the loop count with a first threshold value. In some implementations, the threshold loop count value can be predetermined to set an up-limit of the duty tuning loops using the linear approximation method. Further, the voltage comparator 430 can determine if a duty cross occurs by comparing the voltages values (e.g., voltages V1 and V2 as shown in FIG. 4) of the tuned true clock signal CLK_T and the tuned complementary clock signal CLK_C.

In response to the loop count being less than the first threshold value and a duty cross does not occur ("N" at operation 720), duty cycle correcting method 700 can loop back to operation 710 to perform a next duty tuning operation using the linear approximation method. As shown in FIG. 8, the first five loops of cycle tuning operations use the linear approximation method having a fixed tuning step.

In response to the loop count reaching the first threshold value or a duty cross is detected ("Y" at operation 720), duty cycle correcting method 700 can proceed to operation 730, in which a duty tuning operation can be performed by using the binary weighted approximation method. In some implementations, the controller 440 can determine to switch from the linear approximation method to the binary weighted approximation method based on the determination result at operation 720. For example, as shown in FIG. 8, after the sixth loop of cycle tuning operations using the linear approximation method, a comparison result indicating that the duty of complementary clock signal CLK_C becomes larger than the duty of true clock signal CLK_T, i.e., a duty cross is detected. The controller 440 can accordingly change to the binary weighted approximation method in the subsequent loops of duty tuning operations.

At operation 740, duty cycle correcting method 700 can determine whether a loop count reaches a second threshold value. Similarly, after the duty regulator 450 performs each duty tuning operation, the controller 440 can increase the loop count, and compare the loop count with a second threshold value. In some implementations, the second threshold loop count value can be predetermined to set a maximum time up-limit of the duty correction process. In response to the loop count being less than the second threshold value ("N" at operation 740), duty cycle correcting method 700 can loop back to operation 730 to perform a next duty tuning operation using the binary weighted approximation method.

In response to the loop count being equal to or larger than the second threshold value ("Y" at operation 740), duty cycle correcting method 700 can proceed to operation 750 to execute a duty check. The duty check is executed to determine whether the duty of the clock signal is within a target range. In some implementations, the target range of the duty of the clock signal can be predetermined, such as a range between 45% to 55%, a range between 48% to 52%, or a range between 49% to 51%. Controller 440 can determine whether the duty of the true clock signal CLK_T and the duty of the complementary clock signal CLK_C are within the predetermined target range. In response to determining that the duties of the clock signals are within the target range ("Y" at operation 750), the controller 440 can determine that the duty cycle correction (DCC) process is successful, and can generate a DCC pass signal at operation 762. In response to determining that the duties of the clock signals are not within the target range ("N" at operation 750), the controller 440 can determine that the duty cycle correction (DCC) process is unsuccessful, and can generate a DCC fail signal at operation 764.

As shown in FIG. 8, by using the linear approximation method having a fixed tuning step in a first subset of a first subset of loops of duty tuning operations before the duty cross, and then using the binary weighted approximation having a variable tuning step in a second subset of loops of duty tuning operations after the duty cross, a high correction speed and a high correction precision can be both achieved.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A method for duty cycle correction, comprising:

performing a first loop of duty tuning operations to a clock signal by using a first approximation method;

in response to determining that a first loop count of the first loop reaches a first threshold value, or determining that a duty cross occurs, performing a second loop of duty tuning operations to the clock signal by using a second approximation method different from the first approximation method;

in response to determining that a second loop count of the second loop reaches a second threshold value, executing a duty check to the clock signal; and in response to determining that the clock signal has a duty within a target range, passing the duty cycle correction.

2. The method of claim 1, wherein:

the first approximation method is a linear approximation method; and the second approximation method is a binary weighted approximation method.

3. The method of claim 2, further comprising:

before performing the first loop of duty tuning operations, converting the clock signal to a pair of differentiated clock signals.

4. The method of claim 3, further comprising:

converting the pair of differentiated clock signals to a pair of voltages, respectively; and comparing the pair of voltages to output a comparison signal to indicate whether the duty cross occurs.

5. The method of claim 1, wherein the target range is from about 48% to about 52%.

6. A circuit for duty cycle correction, comprising:

at least one filter configured to convert a clock signal to a voltage;

a voltage comparator configured to compare the voltage with a reference voltage to output a comparison signal;

a controller configured to select, based on the comparing voltage, a duty cycle correction method from a first approximation method and a second approximation method different from the first approximation method; and a duty regulator configured to perform a duty tuning operation to adjust a duty of the clock signal using the selected duty cycle correction method.

7. The circuit of claim 6, wherein:

the first approximation method is a linear approximation method; and the second approximation method is a binary weighted approximation method.

8. The circuit of claim 7, further comprising:

a single-to-differential converter configured to convert the clock signal to a pair of differentiated clock signals.

9. The circuit of claim 8, wherein:

the at least one low pass filter comprises a pair of low pass filters configured to convert the pair of differentiated clock signals to a pair of voltages, respectively; and the voltage comparator is configured to compare the pair of voltages to generate the comparison signal indicating whether a duty cross occurs.

10. The circuit of claim 9, wherein the controller is further configured to:

select the linear approximation method in response to the comparison signal indicating that the duty cross does not occur; and select the binary weighted approximation method in response to the comparison signal indicating that the duty cross occurs.

11. The circuit of claim 10, wherein the controller is further configured to:

count a first loop count of a first subset of loops of duty tuning operations using the linear approximation method; and in response to determining that the first loop count reaches a first threshold value, select the binary weighted approximation method.

12. The circuit of claim 11, wherein the controller is further configured to:

in response to determining that the first loop count does not reach the first threshold value and the comparison signal indicating that the duty cross does not occur, select the linear approximation method.

13. The circuit of claim 12, wherein the controller is further configured to:

count a second loop count of a second subset of loops of duty tuning operations using the binary weighted approximation method; and in response to determining that the second loop count reaches a second threshold value, perform a duty check operation to determine whether the clock signal has a duty within a target range.

14. The circuit of claim 13, wherein the controller is further configured to:

in response to determining that the duty of the clock signal is within the target range, generate a pass signal indicating that the duty cycle correction is successful; and in response to determining that the duty of the clock signal is without the target range, generate a fail signal indicating that the duty cycle correction is unsuccessful.

15. A memory system, comprising:

a memory device; and a peripheral circuit configured to control the memory device, the peripheral circuit comprising a duty cycle correction circuit, wherein the duty cycle correction circuit comprises:

at least one low pass filter configured to convert a clock signal to a voltage, a voltage comparator configured to compare the voltage with a reference voltage to output a comparison signal, a controller configured to select, based on the comparing voltage, a duty cycle correction method from a first approximation method and a second approximation method different from the first approximation method, and a duty regulator configured to perform a duty tuning operation to adjust a duty of the clock signal using the selected duty cycle correction method.

16. The memory system of claim 15, wherein:

the first approximation method is a linear approximation method; and the second approximation method is a binary weighted approximation method.

17. The memory system of claim 16, wherein the duty cycle correction circuit further comprises:

a single-to-differential converter configured to convert the clock signal to a pair of differentiated clock signals.

18. The memory system of claim 17, wherein:

the at least one low pass filter comprises a pair of low pass filters configured to convert the pair of differentiated clock signals to a pair of voltages, respectively; and the voltage comparator is configured to compare the pair of voltages to generate the comparison signal indicating whether a duty cross occurs.

19. The memory system of claim 18, wherein the controller is further configured to:

count a first loop count of a first subset of loops of duty tuning operations using the linear approximation method;

in response to determining that the first loop count reaches a first threshold value or the comparison signal indicating that the duty cross occurs, select the binary weighted approximation method; and in response to determining that the first loop count does not reaches the first threshold value and the comparison signal indicating that the duty cross does not occur, select the linear approximation method.

20. The memory system of claim 19, wherein the controller is further configured to:

count a second loop count of a second subset of loops of duty tuning operations using the binary weighted approximation method; and in response to determining that the second loop count reaches a second threshold value, perform a duty check operation to determine whether the clock signal has a duty within a target range.

\* \* \* \* \*